(12) United States Patent
Maeda

(10) Patent No.: US 6,226,206 B1
(45) Date of Patent: May 1, 2001

(54) SEMICONDUCTOR MEMORY DEVICE INCLUDING BOOST CIRCUIT

(75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/265,042

(22) Filed: Mar. 9, 1999

(30) Foreign Application Priority Data

Mar. 12, 1998 (JP) .................................................. 10-061755

(51) Int. Cl.[7] .................................................. G11C 7/00
(52) U.S. Cl. ...................................... 365/189.09; 365/226
(58) Field of Search .............................. 365/189.09, 226, 365/189.11, 189.05; 327/530, 536, 537

(56) References Cited

U.S. PATENT DOCUMENTS

| 5,426,604 | * | 6/1995 | Oowaki et al. | ........................ 365/149 |
| 5,428,576 | * | 6/1995 | Furuyama | ........................ 365/201 |
| 5,446,418 | * | 8/1995 | Hara et al. | ........................ 365/189.09 |
| 5,621,689 | * | 4/1997 | Sakakibara et al. | ............. 365/189.09 |
| 5,774,405 | * | 6/1998 | Tomishima | ........................ 365/226 |

FOREIGN PATENT DOCUMENTS

| 5-144258 | | 5/1993 | (JP) . |
| 5-198165 | | 5/1993 | (JP) . |
| 6-309868 | | 6/1994 | (JP) . |
| 9-245476 | | 9/1997 | (JP) . |
| 9-320266 | * | 12/1997 | (JP) . |
| 11-45574 | | 11/1999 | (JP) . |

* cited by examiner

*Primary Examiner*—Son Mai
(74) *Attorney, Agent, or Firm*—Ostrolenk, Faber, Gerb & Soffen, LLP

(57) ABSTRACT

Disclosed is a semiconductor memory device, which comprises a plurality of circuits using a voltage obtained by boosting an external power source voltage and power source noises produced by operations of these circuits have no influence on other circuits. The semiconductor memory device including a boost circuit comprises a plurality of circuits using boost voltages, for example, a memory cell array, an output circuit and a plurality of boost circuits, each being provided for the corresponding one of these circuits. With such constitution, a problem of noise interference among the circuits using the boost voltages can be removed.

14 Claims, 5 Drawing Sheets

SEMICONDUCTOR MEMORY DEVICE INCLUDING BOOST CIRCUIT

BACKGROUND OF THE INVENTION

1. Field of the Invention

The present invention relates to a semiconductor memory device including a boost circuit, more particularly to a semiconductor memory device which uses a voltage boosted for both of a memory cell array and an output circuit.

2. Description of the Related Art

In recent years, a voltage to be supplied to a semiconductor memory device from an external power source has been lowered. However, some circuits which are driven preferably by a higher voltage rather than such low voltage are included in internal circuits of the semiconductor memory device. As such circuit, there are, for example, an output circuit and a word line driving circuit.

Accordingly, as-outputted, voltage from the external power source is not supplied to the output circuit and the word line driving circuit, but a voltage obtained by boosting it by a boost circuit is supplied to them. This situation will be described using FIG. 7.

The semiconductor memory device shown in FIG. 7 comprises a memory cell array 26 and an output circuit 27. In the memory cell array 26, many memory cells are included and many word lines for accessing these memory cells are provided. As is well known, a voltage to be applied to the selected word line is higher than the power source voltage by more than a threshold voltage of a transistor. Furthermore, to increase an output speed of data, a voltage higher than the power source voltage is used also in the output circuit 27.

As described above, since the memory cell array 26 and the output circuit 27 need a voltage higher than the power source voltage, a voltage VBOOT which is obtained by boosting the external voltage by a boost voltage generating circuit 25 is supplied to the memory cell array 26 and the output circuit 27.

However, such a conventional semiconductor memory device involves the following problems. Specifically, the voltage VBOOT generated by the boost voltage generating circuit 25 is commonly used for the memory cell array 26 and the output circuit 27. Therefore, when the voltage VBOOT varies due to the operation of the output circuit 27, a driving voltage of the word line driven in the memory cell array varies. Particularly, when this semiconductor memory device is a synchronous DRAM, as its operation frequency becomes higher, the variation of the voltage VBOOT owing to the operation of the output circuit 27 becomes more significant. When the word line is driven in the memory cell array 26 in a situation where the voltage VBOOT is varying, a problem occurs in that poor reading-out/writing operation is brought about and the sensing speed is slowed.

On the contrary, the voltage VBOOT varies also due to the operation of the memory cell array 26. Accordingly, when the voltage VBOOT varies owing to the operation of the memory cell array 26, a performance of the output circuit 27 is degraded, so that a problem occurs that its output speed is lowered and an output timing becomes uneven among its output pins.

With reference to the synchronous DRAM, since data outputting and word line driving are simultaneously performed, the foregoing problem is serious.

On the other hand, when a high speed data outputting and an increase in an output current are desired, the voltage VBOOT for driving the output circuit 27 must be more elevated. However, since the voltage VBOOT is used also for the memory cell array 26, the voltage VBOOT can not be freely set. In other words, the voltage VBOOT must be set within a range which satisfies conditions demanded by the memory cell array 26 and the output circuit 27, so that the range is greatly restricted.

As described above, when the boost voltage VBOOT generated within the semiconductor memory device is shared by the memory cell array 26 and the output circuit 27, there has been a problem that noise interference between the output circuit 27 and the memory cell array 26 occurs and the range for setting the boost voltage VBOOT is greatly restricted so that it is difficult to allow the voltage VBOOT to have a degree of freedom.

SUMMARY OF THE INVENTION

The present invention was made from the viewpoint of the above described problems, and the object of the present invention is to provide a semiconductor memory device including a boost circuit, in which no problem of noise interference among circuits using the boosted voltage VBOOT occurs.

Another object of the present invention is to provide a semiconductor memory device including a boost circuit, in which no problem of noise interference between the output circuit and the memory cell array which use the boost voltage occurs.

Still another object of the present invention is to provide a semiconductor memory device including a boost circuit, in which a setting of the boost voltage VBOOT is not restricted by other circuits.

A semiconductor memory circuit including a boost circuit of the present invention comprises a plurality of circuits using boost voltages, and a plurality of boost circuits, each being provided for corresponding one of the circuits. With such constitution of the semiconductor memory device, no problem of the noise interference among the circuits using the boost voltage occurs.

Furthermore, the boost voltages generated by the plurality of boost circuits can be made to be different from each other.

Furthermore, at least one of the boost circuits should be preferably driven by a signal in synchronization with an external CLK signal.

Furthermore, each of the boost circuits should preferably include a boost voltage generating circuit for supplying a boost power source (VBOOT) for driving a word line of the memory cell array, and a second boost voltage generating circuit for supplying a gate input voltage (VBOOTQ) of an output transistor in the output circuit.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Figure 1:
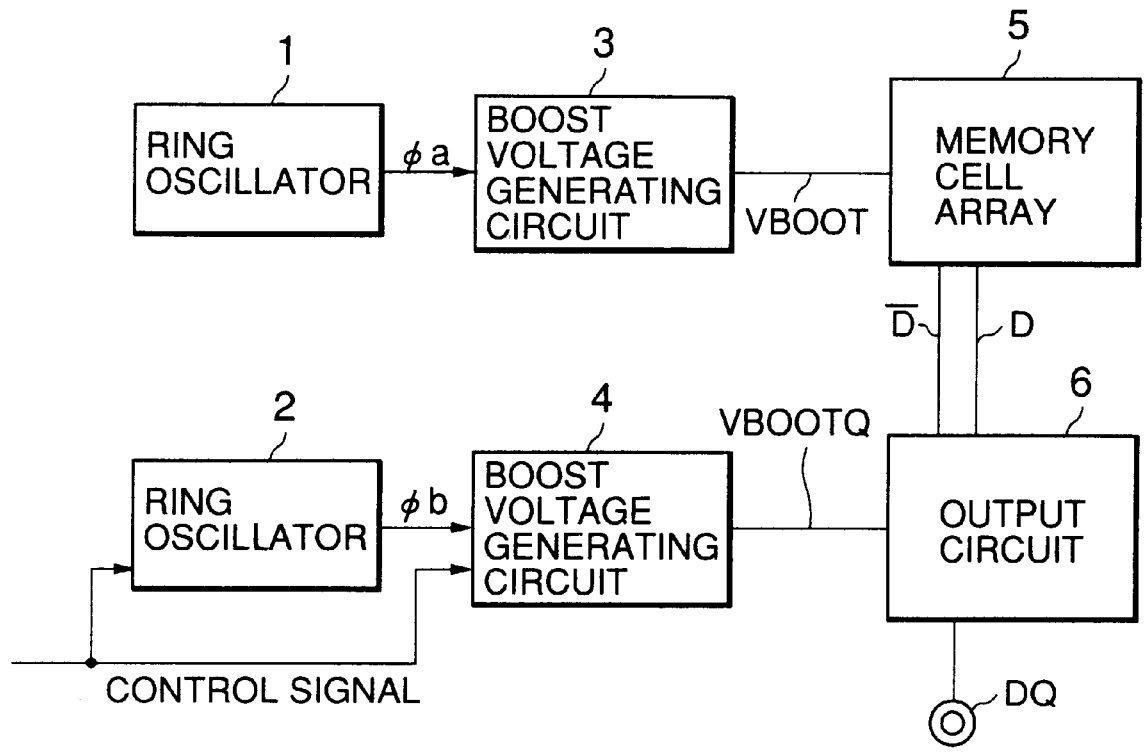
FIG. 1 is a block diagram showing a semiconductor memory device of a first embodiment of the present invention.

Embodiments of the present invention will be in detail described with reference to the accompanying drawings below. FIG. 1 is a circuit diagram showing a semiconductor memory device of a first embodiment of the present invention.

The semiconductor memory device of the first embodiment is a synchronous DRAM, which comprises a memory cell array 5 and an output circuit 6. The memory cell array 5 includes a plurality of memory cells, each of which is selected by corresponding one of word lines. The selected memory cells is connected to the corresponding bit line, and a potential of the bit line varies depending on a potential stored in the selected memory cell. The amplitude of the variation of the potential is amplified by a sense amplifier and appears as internal output data D and /D. The internal output data D and /D are supplied to the output circuit 6.

Hereupon, when the word lines included in the memory cell array 5 are in selected state, a voltage higher than the power source voltage by a threshold voltage of the transistor is applied to the word lines. As well known, the application of such voltage is performed to facilitate charge movements between the bit line and the memory cell by applying the voltage higher than the power source voltage by the threshold voltage of the transistor to the word lines.

Figure 2:
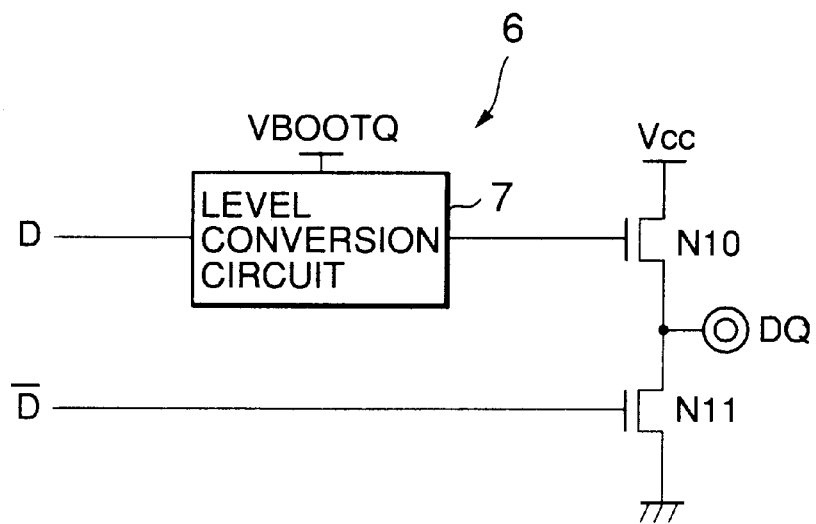
FIG. 2 is a circuit diagram of a boost circuit.

The concrete circuit constitution of the output circuit 6 is shown in FIG. 2.

The output circuit 6 is a circuit which receives the internal output data D and /D supplied from the memory cell array 5 and supplies the output data DQ to an output pin. The internal output data is supplied to the gate of the N channel MOS transistor N10, and the internal output data /D is supplied to the gate of the N channel MOS transistor N11. The internal output data D is not directly supplied to the gate of the N channel MOS transistor N10, but the gate of the N channel MOS transistor N10 via a level converting circuit 7. Hereupon, the level converting circuit 7 is a circuit for converting the voltage of the internal output data D, and when the internal output data D is high in level (Vcc level), the internal output data D is supplied to the gate of the N channel MOS transistor N10 as it is. When the internal output data D is low in level (GND level), the internal output data D is boosted to the VBOOT level and supplied to the gate of the N channel MOS transistor.

As described above, any of the memory cell array 5 and the output circuit 6 needs the voltage higher than the power source voltage Vcc.

Returning to FIG. 1, in the semiconductor memory device of the first embodiment, the boost circuits are independently provided for the memory cell array 5 and the output circuit 6 which requires the voltage higher than the power source voltage Vcc. Each of the boost circuits is composed of a ring oscillator and a boost voltage generating circuit. For example, the boost circuit corresponding to the memory cell array 5 is composed of the ring oscillator 1 and the boost voltage generating circuit 3, and the boost circuit corresponding to the output circuit 6 is composed of the ring oscillator 2 and the boost voltage generating circuit 4.

The ring oscillators 1 and 2 respectively output the pulse signals Φa and Φb, each of which changes its level between the power source (Vcc) level the GND level periodically. Noted that the control signal READU is supplied to the ring oscillator 2.

Figure 3:
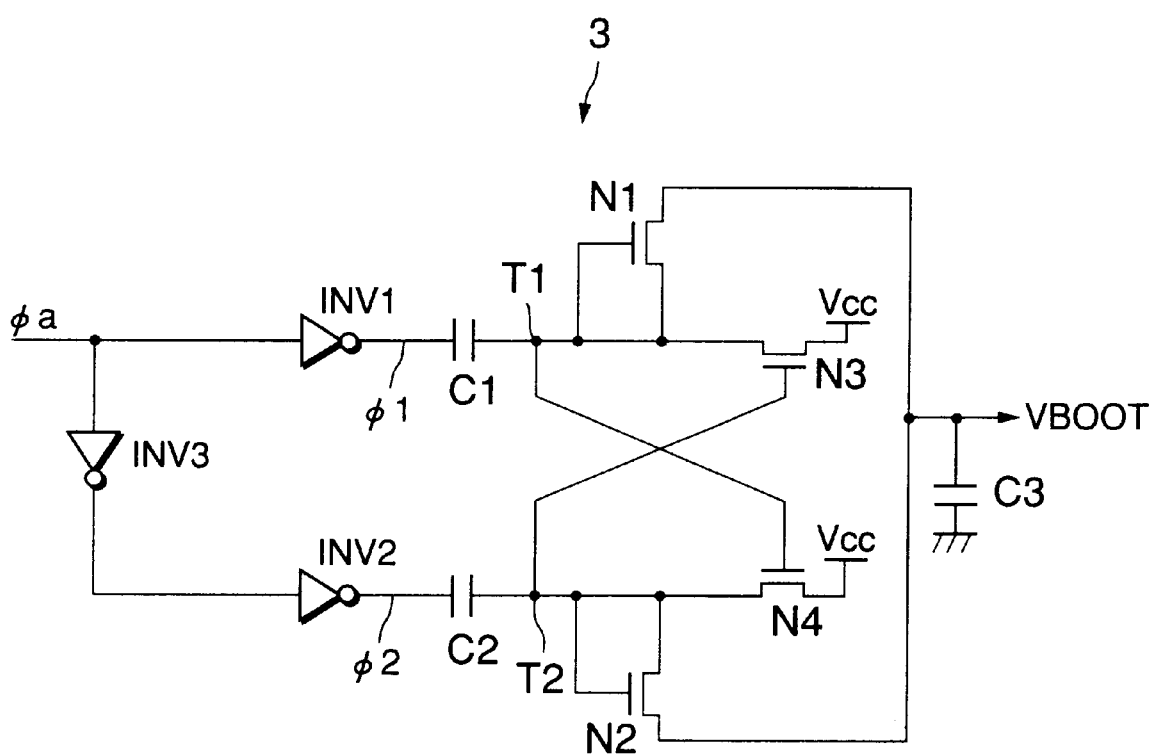
FIG. 3 a circuit diagram of a boost voltage generating circuit.

A concrete circuit constitution of the boost voltage generating circuit 3 is shown in FIG. 3. As shown in FIG. 3, one of the source and drain of the first N type transistor N1 is connected to the boost power source VBOOT and the other thereof is connected to the gate thereof and the first capacitor C1. One of the source and drain of the second N type transistor N2 is connected to the boost power source VBOOT and the other thereof is connected to the gate thereof and the second capacitor C2. One of the source and drain of the third N type transistor N3 is connected to the power source voltage VCC and the other thereof is connected to the first capacitor C1. The gate of the third N type transistor N3 is connected to the second capacitor C2. One of the source and drain of the fourth N type transistor N4 is connected to the power source VCC and the other thereof is connected to the second capacitor C2. The gate of the fourth N type transistor N4 is connected to the first capacitor C1. One terminal of the first capacitor C1 is connected to the output terminal of the inverter INV1, and one terminal of the second capacitor C2 is connected to the output terminal of the inverter INV2. The third capacitor C3 has one terminal connected to the boost power source VBOOT and the other terminal connected to the ground potential point GND.

Figure 4:
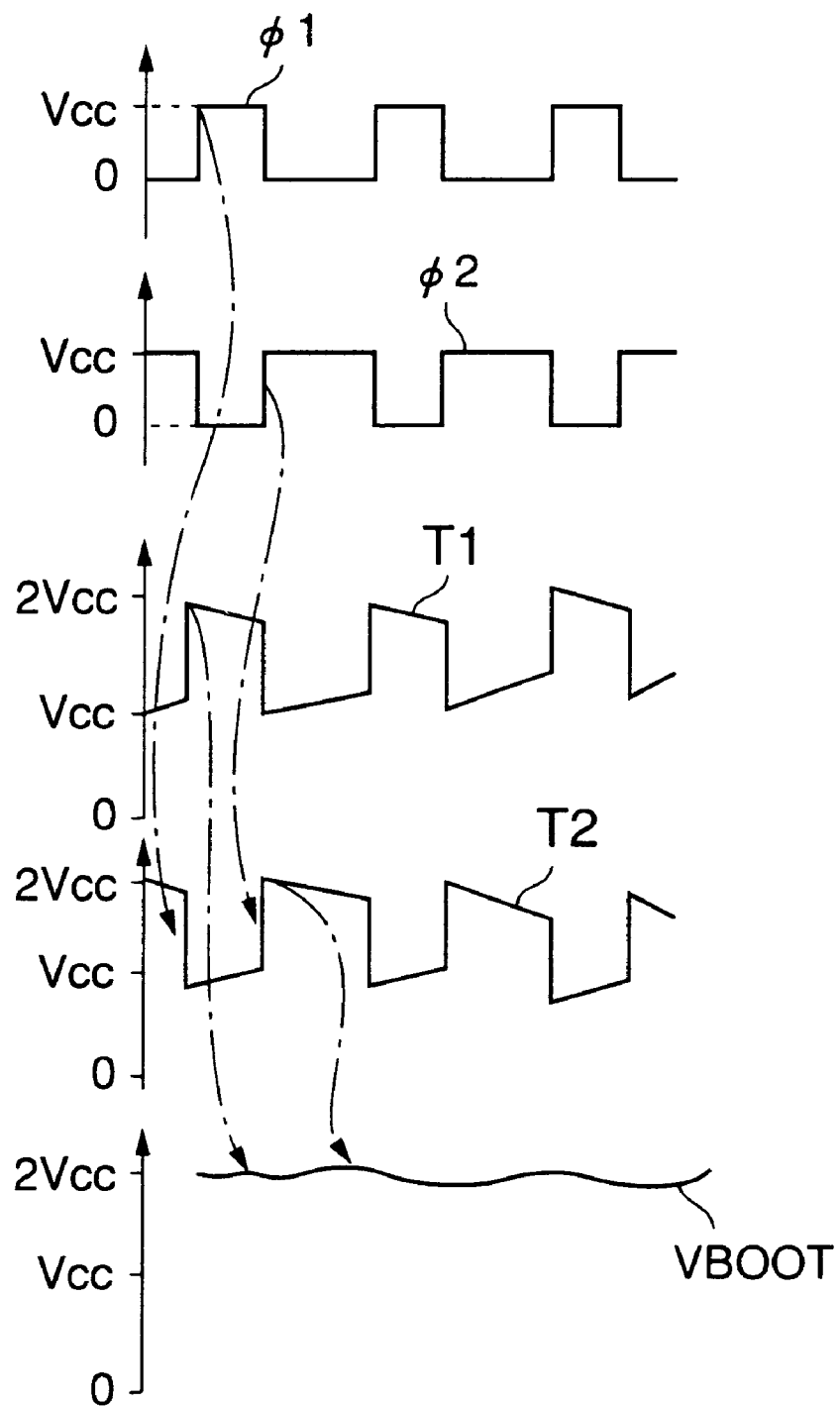
FIG. 4 is a timing chart showing an operation of the boost voltage generating circuit.

An operation of the boost voltage generating circuit 3 will be described with reference to FIG. 4. An input signal to the boost voltage generating circuit 3 is a pulse signal Φa which is an output of the ring oscillator 1. The first control signal Φ1 changes it level between the VCC level and the GND level at a predetermined cycle. The second control signal Φ2 is in the GND level for a predetermined period when the first control signal Φ1 is in the VCC level, and the first control signal Φ2 is in the VCC level for a predetermined period when the first control signal Φ1 is in the GND level. When the firs control signal Φ1 is in the power source voltage level and the second control signal Φ2 is in the GND level (0V), the fourth N type transistor N4 is made to be turned on, and the node T2 of the other terminal of the second capacitor C2 is charged to the power source voltage VCC. Furthermore, when a level in the node T2 of the other terminal of the first capacitor C1 is equal to VBOOT+Vt or more (Vt: a threshold voltage of the transistor), a current flows from the node T1 to the boost voltage output terminal VBOOT via the first N type transistor N1, so that the boost voltage output terminal VBOOT is elevated to a level higher than the power source voltage VCC.

Next, when the first control signal Φ1 changes to the ground voltage level and the second control signal Φ2 changes to the power source voltage level, the level in the node T2 is elevated to a level close to 2VCC, and the third N type transistor N3 is allowed to be turned on, so that the node T1 is charged to the power source voltage VCC. Furhthermore, charges are supplied to the boost voltage output terminal VBOOT via the second N type transistor N2.

The foregoing operation is iterated, so that the boost voltage VBOOT is elevated to a voltage higher than the power source voltage VCC. The third capacitor C3 is a large capacitance capacitor, which serves to suppress the amount of the variation of the boost voltage VBOOT.

Note that though the boost voltage generating circuit 4 is also constituted similarly to the boost voltage generating circuit 3, the control signal READU is supplied to the boost voltage generating circuit 4 in addition to the ring oscillator 2.

As described above, the semiconductor memory device of this embodiment comprises the two ring oscillators 1 and 2, and the two boost voltage generating circuits 3 and 4, and the output VBOOT of the boost voltage generating circuit 3 is supplied to the memory cell array 5. The output VBOOTG of the boost voltage generating circuit 4 is supplied to the output circuit 6. The output signals Φa and Φb of the ring oscillators 1 and 2 are pulse signals which change their levels between the VCC level and the GND level in a predetermined cycle. The control signal READU is a signal which is activated only at the time of reading out data, that is, at the time of outputting the data, and the control signal READU is inputted to the ring oscillator 2 and the boost voltage generating circuit 4.

Next, an operation of the boost circuit of this embodiment constructed as described above will be described. The boost voltage generating circuit 3 is driven by the output pulse Φa which is periodically supplied from the ring oscillator 1 and the boost voltage generating circuit 3 generates the boost voltage VBOOT which is previously set. The boost voltage VBOOT is usually used as a word line driving signal of the memory cell array 5. On the other hand, the boost voltage generating circuit 4 is driven by the output pulse Φb which is periodically supplied from the ring oscillator 2, and the boost voltage generating circuit 4 generates the boost voltage VBOOTQ which is previously set. The boost voltage VBOOTQ is used as the gate input voltage.

The control signal READU is a signal which is activated only at the time of reading out data, that is, at the time of outputting the data. Since the boost voltage VBOOTQ is necessary only at the time of reading out the data, when this signal is in an inactive state due to the control signal READU, the ring oscillator and the boost voltage generating circuit 4 take a mode in which they operates so that the level of the boost voltage VBOOTQ drops. Thus, a power consumption current can be reduced.

As described above, the boost voltages VBOOT and VBOOTQ which are generated by the boost voltage generating circuits 3 and 4 are separated from each other. For this reason, even when the level of the boost voltage VBOOT varies by driving the word line in the memory cell array, the variation of the boost voltage VBOOT does not have effect on the boost voltage VBOOTQ, and a problem of access delay does not occur. Furthermore, on the contrary, even when the data is read out from the memory cell device and the boost voltage VBOOT varies at the time of an operation of the memory cell device with a high frequency, since the boost voltage VBOOTQ is separated from the boost voltage VBOOT, a deterioration of a sensing speed is never brought about.

When a high speed accessing is required or a necessity for changing the output current is produced, the level of the boost voltage VBOOT which is a gate input voltage of the output circuit is changed, whereby the output current can be changed exceedingly effectively, and the high speed accessing can be achieved easily. In the case where the boost voltages VBOOT and BVOOTQ are connected like the conventional semiconductor memory, when the voltage is changed to satisfy one characteristic, the other characteristic is influenced by the change of one characteristic, so that the voltage level can not be freely set. However, like the semiconductor memory device of this embodiment of the present invention, when the boost voltages VBOOT and VBOOTQ are separated from each other, the level of the boost voltage VBOOTQ can be freely set to enhance the characteristic, without the influence on the memory cell array.

As described above, by separating the boost voltages VBOOT and VBOOTQ from each other, which are generated internally, noise interference between the memory cell array and the output circuit can be prevented, and the levels of the boost voltages can be independently set to satisfy the characteristic.

Figure 5:
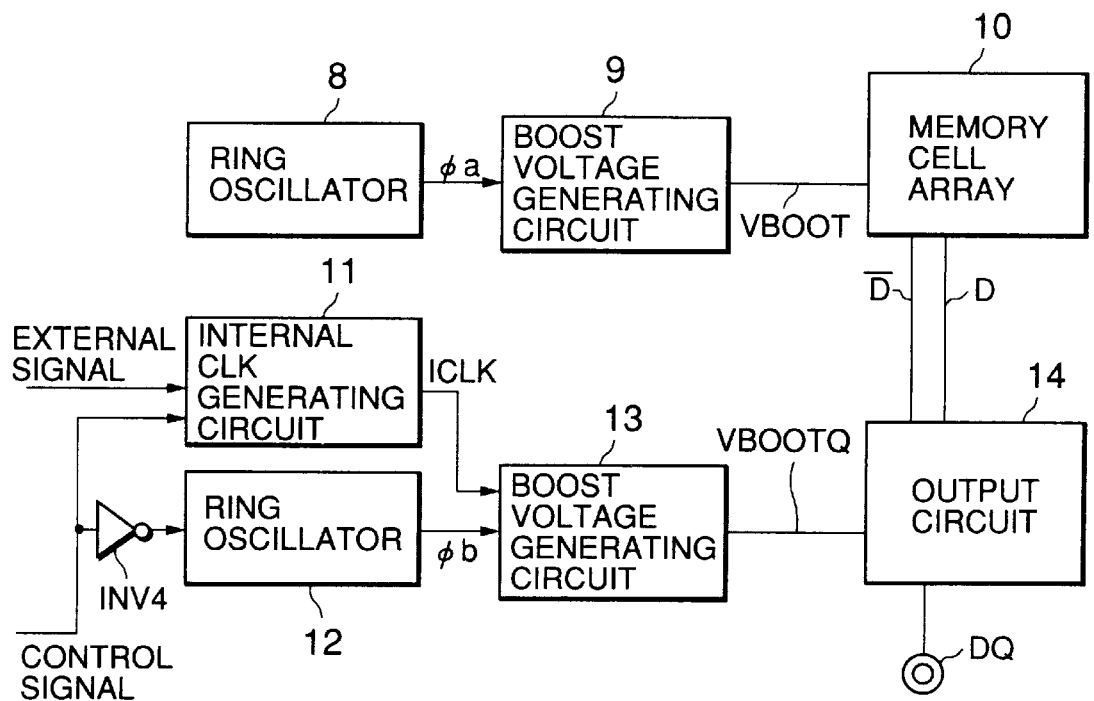
FIG. 5 is a block diagram showing a semiconductor memory device of a second embodiment of the present invention.

Next, a second embodiment of the present invention will be described with reference to FIG. 5. The internal CLK generating circuit 11 is a circuit which upon receipt of the control signal READU, converts the high level and low level of the CLK signal inputted from the outside to the power source voltage VCC and the ground voltage GND, respectively and generates the CLK signal ICLK used therein.

The output signals Φa and Φb of the ring oscillators 8 and 12 changes between the VCC level and the GND level in a predetermined cycle, and the signals Φa and Φb are inputted to the ring oscillator 2 and the boost voltage generating circuit 4. The control signal READU is a signal which is activated only at the time of reading out data, that is, at the time of outputting the data, and the inverted signal obtained by inverting the control signal READU by the inverter INV4 is inputted to the ring oscillator 12. The output VBOOT of the boost voltage generating circuit 9 is supplied to the memory cell array 10, and the output VBOOTQ of the boost voltage generating circuit 13 is supplied to the output circuit 14.

In the synchronous type DRAM (synchronous DRAM), data is outputted in synchronization with the CLK signal supplied from the outside. When the output pulse Φb of the ring oscillator is used for the driving signal of the boost voltage generating circuit 13 which is used for generating the boost voltage supplied to the output circuit, its boost cycle is always constant, so that the output cycle of the data and the boost cycle thereof will be different in general. In this case, when the variation of the level of the boost voltage VBOOT is comparatively large, the boost voltage for each output terminal differs, so that a variation in accessing may occur. For this reason, at the time of the data output, the internal CLK signal ICLK which is generated based on the external CLK signal by the internal CLK generating circuit 11 is used for a signal for driving the boost voltage generating circuit 13, whereby an effective boost in synchronization with the data output cycle will be possible. As described above, with the usage of the internal CLK generating circuit 11, tough the effective boost can be performed, also the ring oscillator 12 will be necessary. When the external CLK signal becomes a input signal of a constant level by a self-refreshing and the like, also the internal CLK signal ICLK generated by the internal CLK generating circuit 11 becomes a constant level, so that the boost voltage generating circuit 13 can not be driven. Accordingly, the level of the boost voltage VBOOTQ drops. In this situation, when the self-refreshment is completed and data reading-out operation starts immediately after the self-refreshment, the boost voltage VBOOTQ is not in a predetermined level at this time, so that a problem of a delay in access occurs. For this reason, at the time other than the output state, in order to maintain the level of the boost voltage VBOOTQ, the ring oscillator 12 is also necessary.

As described above, the internal CLK signal ICLK made from the external CLK signal is used for the driving signal of the boost voltage generating circuit 13 which generates the boost voltage VBOOTQ used for the output circuit, whereby also the ring oscillator 12 will be necessary, in addition to the internal CLK generating circuit 11 which can perform the effective boost in synchronization with the data output cycle.

Figure 6:
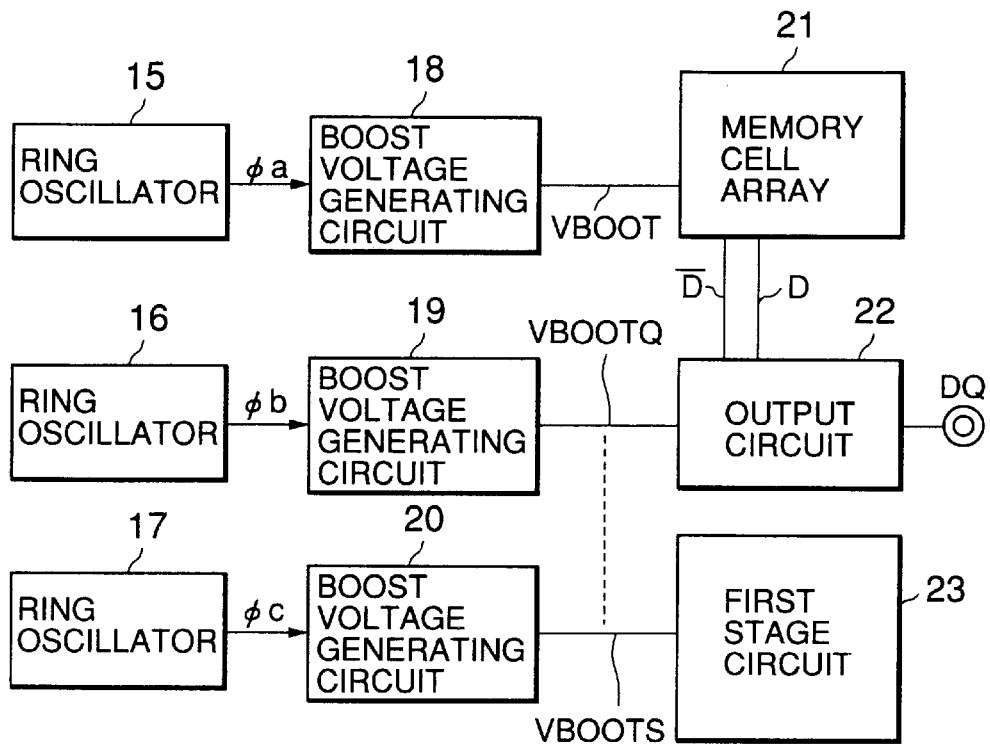
FIG. 6 is a block diagram showing a semiconductor memory device of a third embodiment of the present invention.
Figure 7:
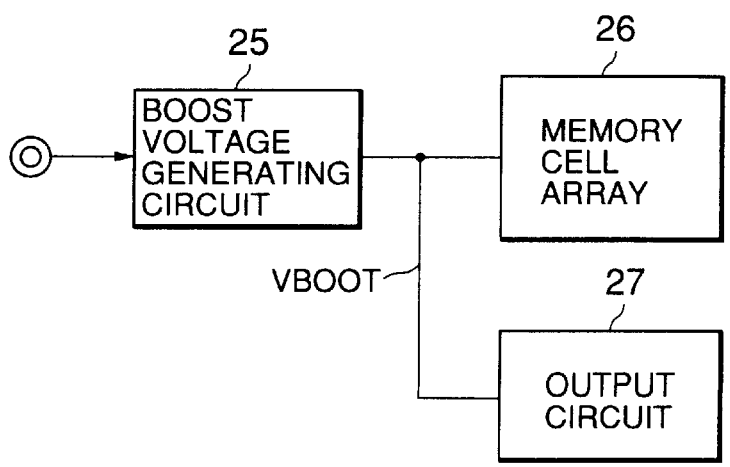
FIG. 7 is a block diagram showing a convention semiconductor memory device.

FIG. 6 is a block diagram showing a third embodiment of the present invention. This embodiment uses one of boost voltage generating circuits 18, 19 and 20, for example, the boost voltage generating circuit 20, as a power source for a first stage circuit 23. Outputs Φa, Φb and Φc of the ring oscillators 15, 16 and 17 are inputted to the boost voltage generating circuits 18, 19 and 20, respectively. The boost voltage VBOOT generated by the boost voltage generating circuit 18 is used as a word line driving signal of the memory cell array 21. The boost voltage VBOOTQ generated by the boost voltage generating circuit 19 is used for an input voltage of the output circuit 22. The boost voltage VBOOT generated by the boost voltage generating circuit 20 is used for a power source voltage of the first stage circuit 23.

In the semiconductor memory device, particularly the synchronous DRAM, when internal circuits of the semiconductor memory device operate with a lower voltage than the power source voltage VCC at the request of low voltage operations, there may be some internal circuits which can not satisfy their characteristics. By using the boost voltages generated by the boost voltage generating circuits 18, 19 and 20 for such internal circuits, they will be able to satisfy their characteristics.

Furthermore, although it is possible to set the plurality of boost voltages generated within the semiconductor memory device to different voltages from each other, when the boost voltages VBOOT and VBOOTS are set to the same voltage level as illustrated by the dotted lines of FIG. 6, it is also possible to connect to each other. This is effective when the driving of the boost voltage generating circuits 19 and 20 contributes to stabilizing the levels of the boost voltages VBOOTQ and VBOOTS, as well as when the problem of noises due to the connection does not have severe influence.

As described above, according to the present invention, it is possible to prevent the noise interference between the memory cell array and the output circuit which use the boost voltage generated within the semiconductor memory device. Furthermore, since the boost voltages used for the memory cell array and the output circuit are separated from each other, the boost voltages can be freely set, so that desired characteristics can be obtained.

What is claimed is:

1. A semiconductor memory device, comprising:
   a memory cell array receiving a first boost voltage;
   a data output pin;
   an output circuit for supplying data read out from said cell memory cell array to said data output pin and receiving a second boost voltage;
   a first boost circuit boosting a power source voltage to generate said first boost voltage; and
   a second boost circuit boosting said power source voltage to generate said second boost voltage and activated by a data read control signal.

2. The semiconductor memory device as claimed in claim 1, wherein said first and second boost voltages are different from each other.

3. The device as claimed in claim 1,
   wherein said second boost circuit has first and second modes, said second boost circuit generating said second boost voltage in a first driving ability during said first mode, said second boost circuit generating said second boost voltage in a second driving ability which is stronger than said first ability during said second mode, said first mode corresponding to a first period when said data read control signal is activated, said second mode corresponds a second period when said data read control signal is non-activated and said data read control signal is activated only at the time of reading out data.

4. A semiconductor memory device comprising:
   a first boost circuit boosting a first power voltage supplied from a first power supply line to generate a first boost voltage;
   a second boost circuit boosting said first power voltage supplied from said first power supply line to generate a second boost voltage, said second boost circuit activated by a data read control signal;
   a memory cell array supplied with said first boost voltage;
   a first data line receiving first data read out from said memory cell array;
   a second data line receiving second data inverted to said first data read out from said memory cell array;
   a level converting circuit having an input node connected to said first data line and an output node, said level converting circuit converting a level of said first read data supplied to said input node thereof to said second boost voltage;
   a first transistor connected between a first power supply line and a data output terminal, said first transistor having a control electrode connected to said output node of said level converting circuit; and
   a second transistor connected between a second power supply line and said data output terminal.

5. The device as claimed in claim 1, wherein said first boost voltage is higher than the power source voltage and said second boost voltage is higher than the power source voltage.

6. The device as claimed in claim 5, further comprising:
   a first ring oscillator coupled to said first boost circuit and producing a first pulse signal to be applied to said first boost circuit; and
   a second ring oscillator coupled to said second boost circuit, producing a second pulse signal to be applied to said second boost circuit, said second ring oscillator activated by said data read control signal.

7. The device as claimed in claim 4, wherein said second boost circuit has first and second modes, said second boost circuit generating said second boost voltage in a first driving ability during said first node, said second boost circuit generating said second boost voltage in a second driving ability which is stronger than said first ability during said second node, said first mode corresponding to a first period when said data read control signal is activated, said second mode corresponding to a second period when said data read control signal is non-activated and said data read control signal is activated only at the time of reading out data.

8. The device as claimed in claim 7, wherein said first boost voltage is higher than the power source voltage and said second boost voltage is higher than the power source voltage.

9. The device as claimed in claim 8, further comprising:
   a first ring oscillator coupled to said first boost circuit and producing a first pulse signal to be applied to said first boost circuit; and a second ring oscillator coupled to said second boost circuit, producing a second pulse signal to be applied to said second boost circuit, said second ring oscillator activated by said data read control signal.

10. A semiconductor memory device, comprising:

a first boosted potential supply line;

a second boosted potential supply line independent from said first boosted potential supply line;

a first boost circuit generating a first boost voltage and conveying said first boost voltage to said first boosted potential supply line;

a second boost circuit generating a second boost voltage and conveying said second boost voltage to said second boosted potential supply line, said second boost circuit controlled in response to a data read control signal;

a first ring oscillator coupled to said first boost circuit and supplying a first pulse to said first boost circuit; and a second ring oscillator coupled to said second boost circuit and supplying a second pulse to said second boost circuit.

11. The device as claimed in claim 10, wherein said second boost circuit is activated when said data read control signal is at a first logic level and said second boost circuit is non-activated when said data read control signal is at a second logic level.

12. The device as claimed in claim 11, wherein said second ring oscillator receives said data read control signal so that said second ring oscillator is activated when said data read control signal is at said first logic level and said second boost circuit is non-activated when said data read control signal is at said second logic level.

13. The device as claimed in claimed in claim 12, further comprising:

a memory cell array coupled to said first boosted potential supply line and supplied with said first boost voltage; and an output circuit coupled to said second boosted potential supply line supplied with conveyed by said second boost voltage.

14. The device as claimed in claim 10, further comprising:

an internal clock generating circuit generating an internal clock in response to an external signal when said data read control signal is at a first logic level and stopping generating said internal clock when said data read control signal is at a second logic level;

wherein said second ring oscillator receives said data read control signal to generate said second pulse when said data read control signal is at said second logic level and stops generating said second pulse when said data read control signal is at said first logic level; and said second boost circuit produces said second boost voltage in response to one of said internal clock and said second pulse.

* * * * *